(12) United States Patent
Qiu et al.

(10) Patent No.: US 7,687,330 B2
(45) Date of Patent: Mar. 30, 2010

(54) TFT-LCD PIXEL STRUCTURE AND MANUFACTURING METHOD THEREOF

(75) Inventors: Haijun Qiu, Beijing (CN); Zhangtao Wang, Beijing (CN); Tae Yup Min, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 12/270,008

(22) Filed: Nov. 13, 2008

(65) Prior Publication Data
US 2009/0236605 A1 Sep. 24, 2009

(30) Foreign Application Priority Data
Mar. 21, 2008 (CN) .......................... 2008 1 0102479

(51) Int. Cl.
*H01L 21/00* (2006.01)
(52) U.S. Cl. .......................... 438/151; 438/22; 438/29; 438/34; 438/149; 438/158; 257/57; 257/59; 257/250; 257/330; 257/E21.143; 257/E21.414
(58) Field of Classification Search .................. 438/28, 438/160; 257/158
See application file for complete search history.

(56) References Cited

U.S. PATENT DOCUMENTS 6,207,480 B1 * 3/2001 Cha et al. .................... 438/149
2002/0021376 A1 * 2/2002 Yoo et al. ..................... 349/40

* cited by examiner

*Primary Examiner*—N Drew Richards
*Assistant Examiner*—Kyoung Lee
(74) *Attorney, Agent, or Firm*—Ladas & Parrry LLP

(57) ABSTRACT

A thin film transistor liquid crystal display (TFT-LCD) pixel structure comprising: a gate line and a gate electrode formed on a substrate; a first insulating layer, a semiconductor layer, and a doped semiconductor layer formed sequentially on the gate electrode and the gate line, wherein an isolating groove is formed above the gate line which disconnects the semiconductor layer on the gate line; a second insulating layer covering the isolating groove and a portion of the substrate where the gate line and the gate are not formed; a pixel electrode formed on the second insulating layer, wherein the pixel electrode is integral with a drain electrode and is connected with the doped semiconductor layer on the gate electrode at a place where the drain electrode is formed; a source electrode, which is a portion of a data line, formed on the doped semiconductor layer; and a channel formed between the source electrode and the drain electrode.

17 Claims, 6 Drawing Sheets

TFT-LCD PIXEL STRUCTURE AND MANUFACTURING METHOD THEREOF

FIELD OF THE INVENTION

The present invention relates to a method of manufacturing a thin film transistor liquid crystal display (TFT-LCD) and the TFT-LCD thus manufactured.

BACKGROUND OF THE INVENTION

At present, a liquid crystal displays (LCD) exemplified by a TFT-LCD has become one very important type of flat panel displays and has attracted extensive attention. During manufacture of a TFT-LCD, efforts have been made to adopt a more advanced manufacturing method, simplify producing process, and reduce production cost. Among the others, simplification of process and the reduction of production cost for each device of a TFT-LCD directly lead to the simplification of manufacturing process and the reduction of production cost of the whole TFT-LCD.

A LCD generally comprises an upper substrate and a lower substrate which are joined together by a seal agent. Electrodes are formed on the upper and lower substrates, and liquid crystal material is filled between the two substrates. Particles of a certain diameter are distributed between the two substrates to maintain a constant gap between the two substrates. A thin film transistor (TFT) is formed on the surface of the lower substrate as a switching element. The TFT can comprise a gate electrode connected with a gate line, a source electrode connected with a signal line, and a drain electrode connected with a pixel electrode. Specifically, the TFTs used for a TFT-LCD commonly comprise a gate electrode which may be a portion of the gate line, an active layer (comprising a semiconductor layer and a doped semiconductor layer) which forms a channel, a source electrode which may be a portion of the data line, and a drain electrode which opposes the source on the active layer and is electrically connected with the pixel electrode. The TFT, as a switching element, controls, under the electrical signal transmitted to the gate electrode through the gate line, the transmission of the data signal transmitted through the data line to the pixel electrode.

In recent years, in a conventional method of manufacturing a TFT-LCD, an array forming process is widely used, in which patterning processes by photolithography with a mask are performed for several times on a glass base substrate to form a TFT array. Since the mask for exposing is very expensive, it is an efficient method to decrease production cost by reducing the times of photolithography with a mask. However, decrease of the times of photolithography with a mask may render other processes in manufacturing a TFT-LCD complicated and may even make impossible to carry out such processes.

One currently popular method of manufacturing a TFT-LCD is a four-mask method, in which photolithography processes are carried out for four times, for which four masks are needed. In addition, processes such as deposition, etching, and/or stripping are necessary for forming a pattern. In the four-mask manufacturing method, a gray tone mask technology can be used for etching to form the source/drain metal electrodes and the channel portion of the active layer of the TFT. The fabrication of these portions is the key for manufacturing a TFT-LCD, which, in practice, imposes rigorous requirements on etching selectivity and the photolithography process and further brings complication to the manufacturing process.

Therefore, there is a need for a method of manufacturing a TFT-LCD which uses less masks and which is also simple in procedure and easy to carry out.

SUMMARY OF THE INVENTION

An embodiment of the invention provides a thin film transistor liquid crystal display (TFT-LCD) pixel structure comprising: a gate line and a gate electrode formed on a substrate; a first insulating layer, a semiconductor layer, and a doped semiconductor layer formed sequentially on the gate electrode and the gate line, wherein an isolating groove is formed above the gate line which disconnects the semiconductor layer on the gate line; a second insulating layer covering the isolating groove and a portion of the substrate where the gate line and the gate are not formed; a pixel electrode formed on the second insulating layer, wherein the pixel electrode is integral with a drain electrode and is connected with the doped semiconductor layer on the gate electrode at a place where the drain electrode is formed; a source electrode, which is a portion of a data line, formed on the doped semiconductor layer; and a channel formed between the source electrode and the drain electrode.

Another embodiment of the invention provides a method for manufacturing a thin film transistor liquid crystal display (TFT-LCD) pixel structure comprising the following steps:

(I) depositing sequentially a gate conductive layer, a first insulating layer, a semiconductor layer and a doped semiconductor layer on a substrate, forming a first photoresist pattern with a first gray tone mask to comprise a first non-photoresist region, a first partially retained photoresist region and a first fully retained photoresist region on the substrate; etching the first non-photoresist region to form a gate line and a gate electrode; ashing the first photoresist pattern to remove the photoresist in the first partially retained photoresist region to expose a portion of the doped semiconductor layer on the gate line and thin the photoresist in the first fully retained photoresist region, and then etching the exposed portion of the doped semiconductor layer and the underlying semiconductor layer to form an isolating groove above the gate line; depositing a second insulating layer, and lifting off the remained first photoresist pattern along with the second insulating layer deposited thereon on the gate line and the gate electrode; and (II) depositing sequentially a pixel electrode layer and a source/drain electrode layer on the substrate after step I, forming a second photoresist pattern with a second gray tone mask to comprise a second non-photoresist region, a second partially retained photoresist region and a second fully retained photoresist region; etching the second non-photoresist region to form a channel of a TFT, a pixel electrode and a drain electrode which is integral with the pixel electrode, and a data line and a source electrode which is integral with the data line; ashing the second photoresist pattern to remove the photoresist in the second partially retained photoresist region to expose the source electrode and the data line and thin the photoresist in the second fully retained photoresist region; depositing a passivation layer, lifting off the remained second photoresist pattern along with the passivation layer deposited thereon on the pixel electrode, and etching the source/drain electrode layer in the region on the substrate corresponding to the pixel electrode and the drain electrode to expose the pixel electrode.

The TFT-LCD pixel structure and the manufacturing method thereof according to the embodiments of the present invention can reach the following advantages.

A second insulating layer is deposited during the first photolithography process so that the pixel structure can be planarized, which provides process tolerance for subsequent processes. In addition, a portion of the transparent pixel electrode is also used as the drain electrode of the TFT, which can avoid the problem about contact resistance.

As compared with the conventional method, two masks can be used to manufacture a TFT-LCD pixel structure, the number of masks can be decreased, the cost for the array process and the seizing time can be reduced, and the production volume and yield can be improved. In addition, since the number of the masks and also exposure processes is decreased, the complication of the process can be reduced, the process tolerance can be increased, and the production volume and yield can be improved.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein:

FIG. 1A' is a cross-sectional view along line B-B' in FIG. 1;

FIG. 1B' is a cross-sectional view along line B-B' in FIG. 1 after ashing of the photoresist during the first photolithography process;

FIG. 1C' is a cross-sectional view along line B-B' in FIG. 1 after etching of the semiconductor layer during the first photolithography process;

FIG. 1D' is a cross-sectional view along line B-B' in FIG. 1 after deposition of the second insulating layer during the first photolithography process;

FIG. 1E' is a cross-sectional view along line B-B' in FIG. 1 after the lifting-off process during the first photolithography process;

FIG. 1' is a plan view showing the pixel structure in which the first photolithography process is completed;

DESCRIPTION OF THE PREFERRED EMBODIMENTS

Embodiments of the present invention are described below in detail with reference to the accompanying drawings. In this disclosure, a gray tone mask may be a mask with a transparence region, a translucence region and a blocked region, and the translucence region can be obtained with slits that can diffract light, a translucent material of low transmissivity and the like, thus a gray tone mask also comprises a half tone mask.

Figure 1:
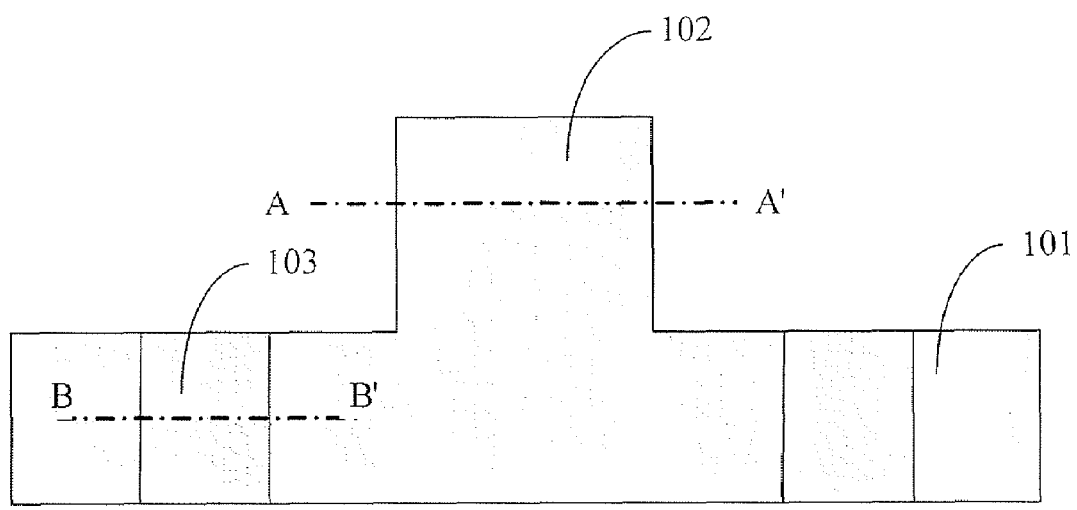
FIG. 1 is a top view showing a pattern after a first photolithography is carried out with the first gray tone mask.
Figure 1A:
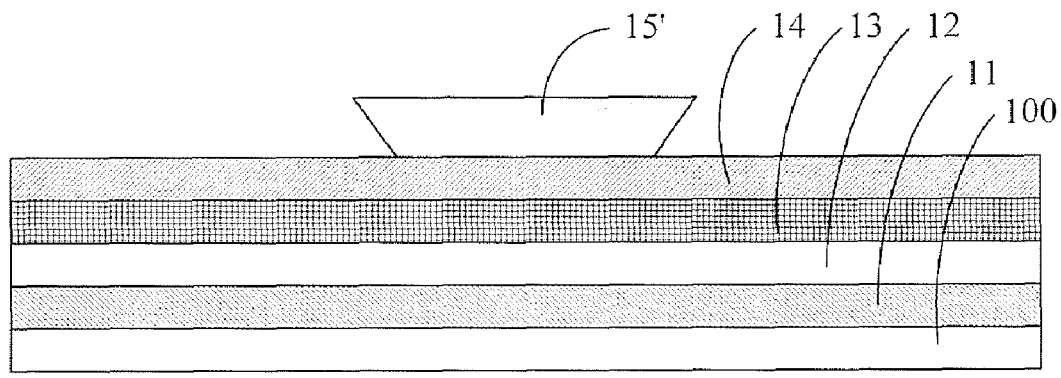
FIG. 1A is a cross-sectional view along line A-A' in FIG. 1.
Figure 1A:
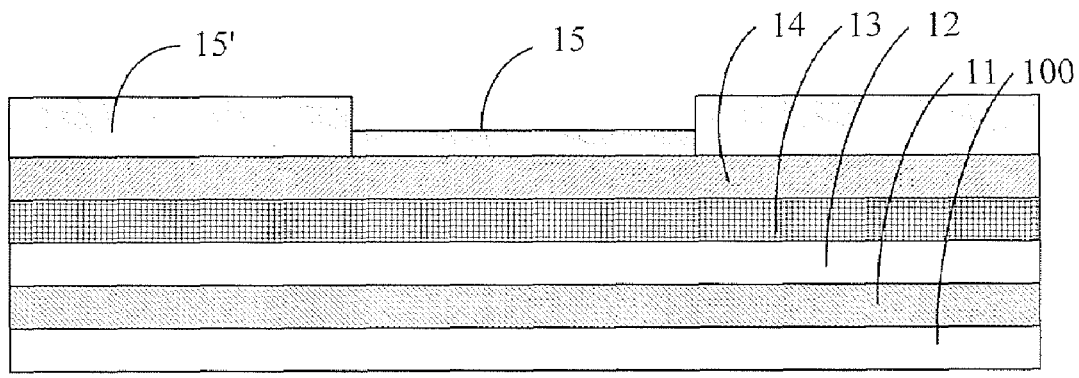
Figure 1B:
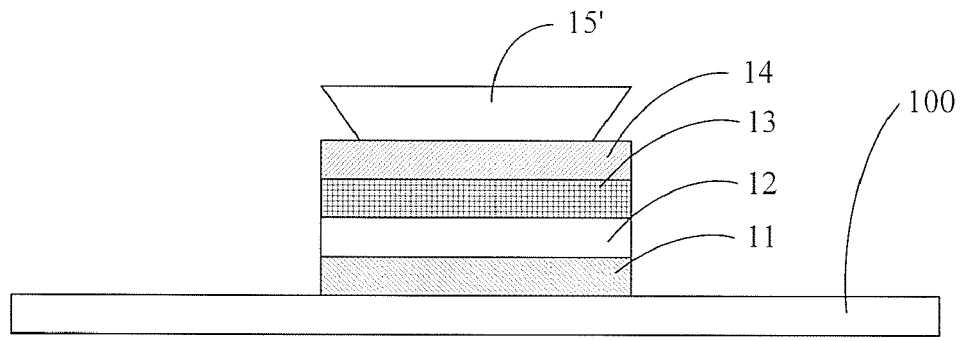
FIG. 1B is a cross-sectional view along line A-A' in FIG. 1 after etching on the non-photoresist region during the first photolithography process.
Figure 1C:
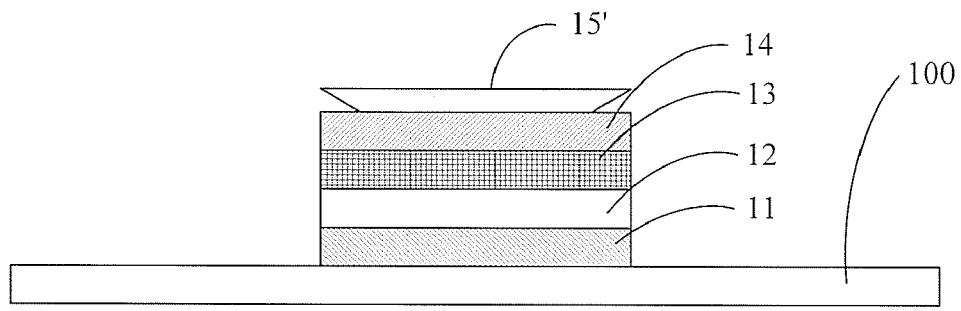
FIG. 1C is a cross-sectional view along line A-A' in FIG. 1 after ashing of the photoresist during the first photolithography process.
Figure 1B:
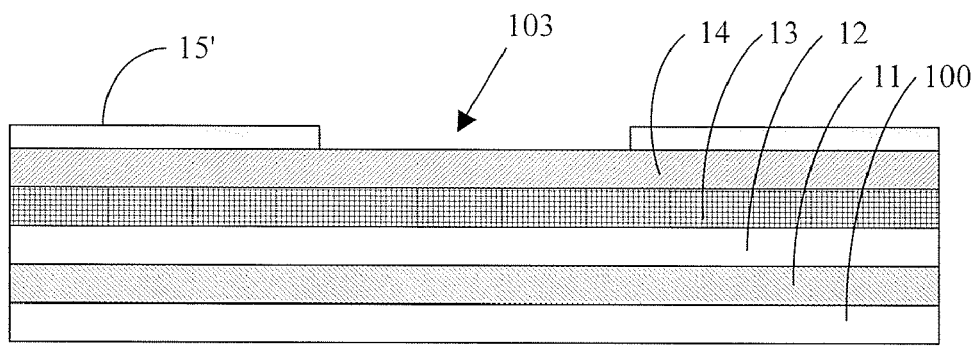
Figure 1C:
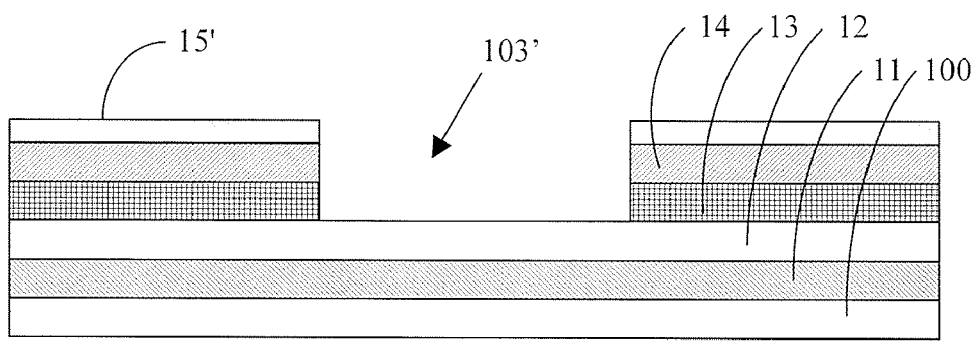

FIG. 1 is a top view showing a pattern after a first photolithography is carried out with a first gray tone mask, FIG. 1A is a cross-sectional view along line A-A' in FIG. 1, and FIG. 1A' is a cross-sectional view along line B-B' in FIG. 1. As shown in FIGS. 1, 1A, and 1A', a gate conductive layer 11, a first insulating layer 12, a semiconductor layer 13, and a doped semiconductor layer 14 are deposited in sequence on a substrate 100, a photoresist film is applied on the resultant layer structure, and an exposure process with the first gray tone mask and development process are carried out to form a photoresist pattern corresponding to a gate line and gate island pattern, as shown in FIG. 1. As can be seen from FIGS. 1, 1A, and 1A', there is no photoresist in the region other than a gate line 101 and a gate electrode 102 that are to be formed, an isolating groove 103 is to be formed on the gate line and corresponds to the partially retained photoresist region 15 in the first photolithography process, and the portions other than the isolating groove 103 on the gate line corresponds to the fully retained photoresist region 15' in the first photolithography. Then, etching is carried out by using the photoresist pattern as an etching mask so that the region which is not protected by the photoresist pattern is removed, i.e., the doped semiconductor layer 14, the semiconductor layer 13, the first insulating layer 12, and the gate conductive layer 11 in the non-photoresist region that is not covered by the photoresist is etched away. FIG. 1B shows a cross-sectional view along line A-A' in FIG. 1 after etching on the non-photoresist region. Then, an ashing process on photoresist is carried out. The cross-sectional view along line A-A' in FIG. 1 after ashing is shown in FIG. 1C, and the cross-sectional view along line B-B' in FIG. 1 after ashing is shown in FIG. 1B'. As shown in FIG. 1B', a portion of the doped semiconductor layer 14 corresponding to the isolating groove 103 on the gate line is exposed, and the fully retained photoresist region 15' is thinned in thickness. The exposed portion of the doped semiconductor layer 14 and the semiconductor layer 13 under the doped semiconductor layer 14 are etched to form the isolating groove 103' on the gate line, as shown in FIG. 1C'.

Figure 1D:
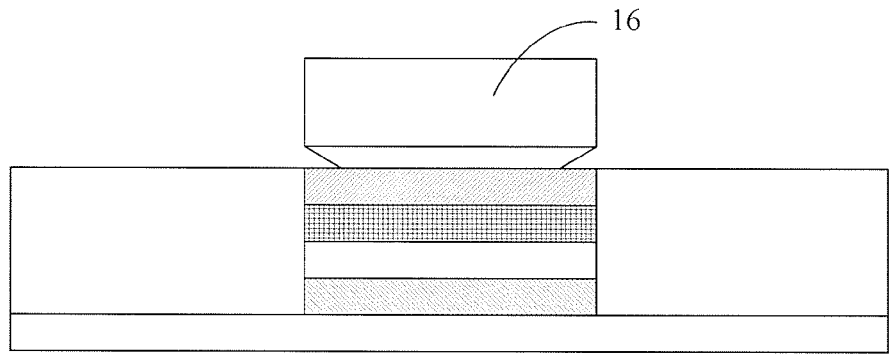
FIG. 1D is a cross-sectional view along line A-A' in FIG. 1 after deposition of the second insulating layer during the first photolithography process.
Figure 1E:
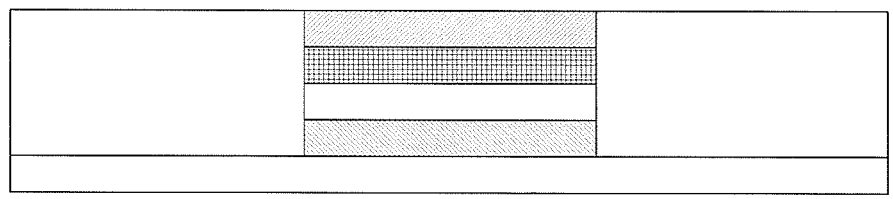
FIG. 1E is a cross-sectional view along line A-A' in FIG. 1 after the lifting-off process during the first photolithography process.
Figure 1D:
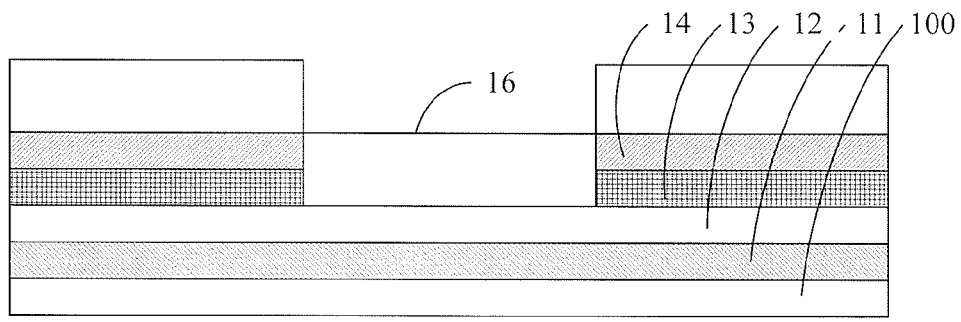
Figure 1E:
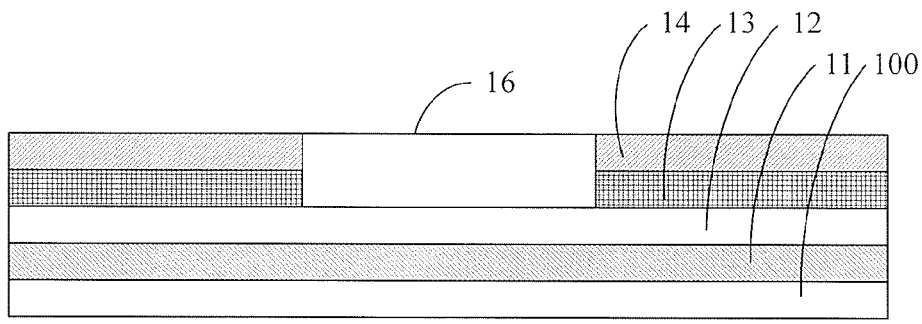
Figure 1:
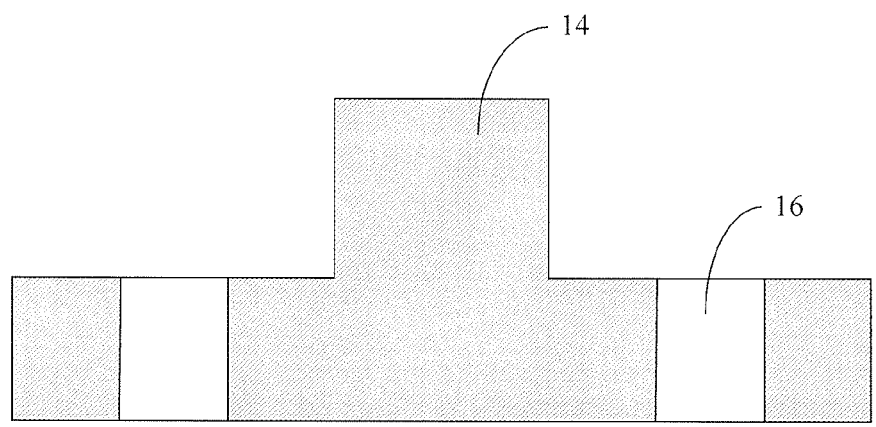

Then, a second insulating layer 16 is deposited to protect the gate line and gate electrode. The cross-sectional view along line A-A' in FIG. 1 after deposition of the second insulating layer is shown in FIG. 1D. A lift-off process is carried out to remove the fully retained photoresist region 15' together with the second insulating layer 16 deposited thereon. The cross-sectional view along line A-A' in FIG. 1 after the lift-off process is shown in FIG. 1E. The cross-sectional view along line B-B' in FIG. 1 after deposition of the second insulating layer 16 is shown in FIG. 1D'. The semiconductor layer 13 corresponding to the isolating groove 103' is covered by the second insulating layer 16.

The substrate 100 may be a glass substrate or a plastic substrate. The gate conductive layer 11 may be a single layer film of Al/Nd, Al, Cu, Mo, Mo/W or Cr, or a composite film of any combination of Al/Nd, Al, Cu, Mo, Mo/W and Cr. The first insulating layer 12 and second insulating layer 16 may be a single layer film of SiNx, SiOx or SiOxNy, or a composite film of any combination of SiNx, SiOx and SiOxNy. Both of the first insulating layer 12 and the second insulating layer 16 may be transparent so as to allow transmission of light. The semiconductor layer 13 may comprise amorphous silicon (a-Si), poly-silicon (p-Si) and the like. The doped semiconductor layer 14 may be doped with a dopant such as boron (B) or phosphor (P).

Here, all the processes with the first gray tone mask have been described, and the plan view of the pixel structure after the processes are completed is shown in FIG. 1'. As can be seen from the above processes, in the present embodiment, a second insulating layer is deposited during the first photolithography process so that the pixel structure is planarized, which provides process tolerance for subsequent processes. In addition, the conventional gray tone mask and lift-off process for manufacturing a TFT-LCD can be used in the first photolithography process, which makes the first photolithography process easy to implement.

Figure 2:
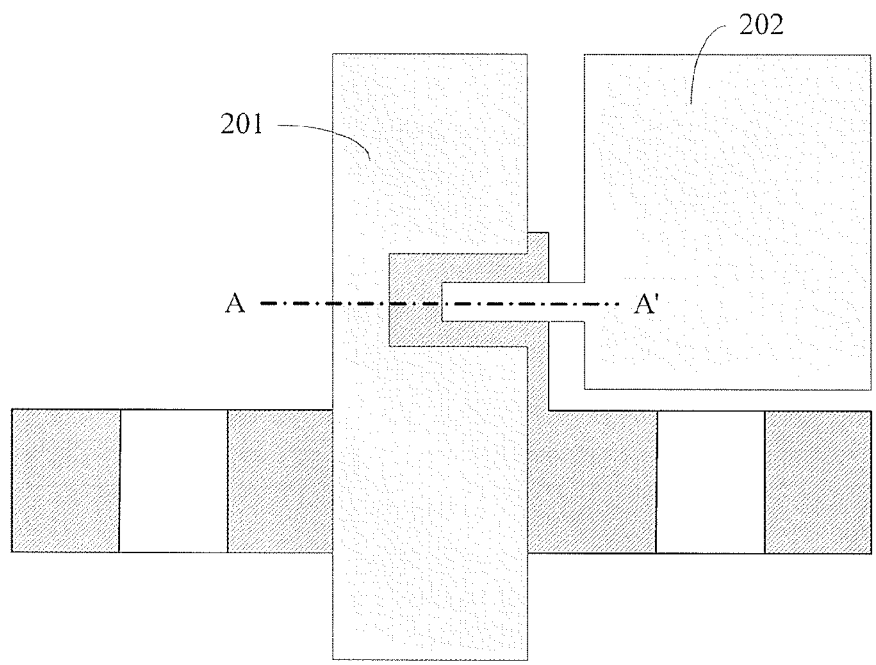
FIG. 2 is a view showing the pattern after a second photolithography is carried out with a second gray tone mask.
Figure 2A:
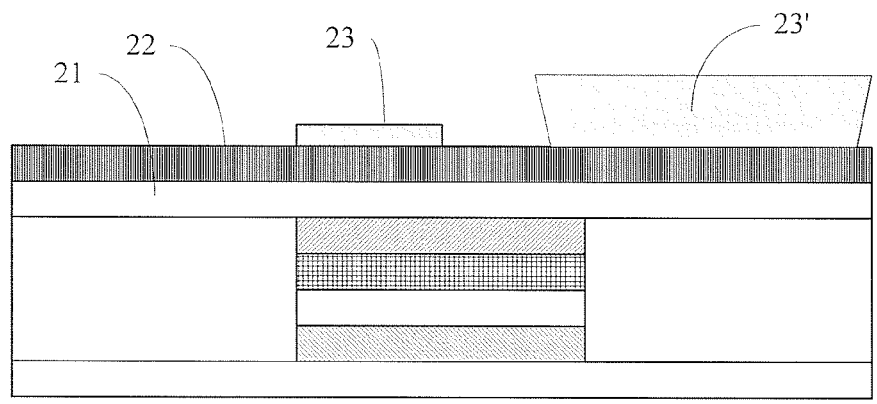
FIG. 2A is a cross-sectional view along line A-A' in FIG. 2.
Figure 2B:
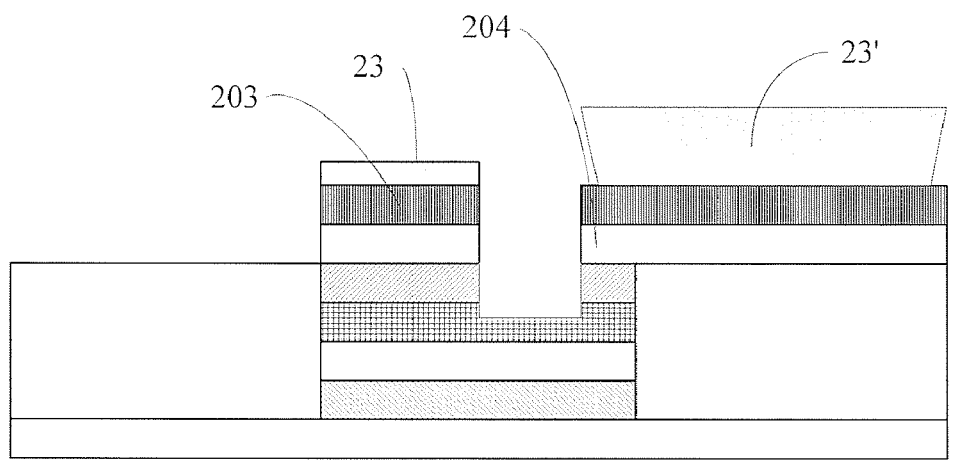
FIG. 2B is a cross-sectional view along line A-A' in FIG. 2.
Figure 2C:
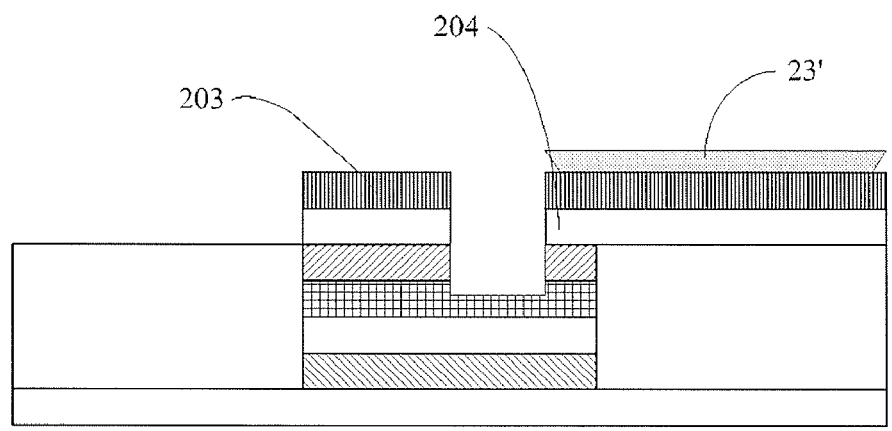
FIG. 2C is a cross-sectional view along line A-A' in FIG. 2 after ashing of the photoresist during the second photolithography process.

Then, a transparent pixel electrode layer 21 and a source/drain electrode layer 22 are deposited in sequence over the pixel structure after the above processes. A photoresist film is applied on the resultant structure, and an exposure process with a second gray tone mask and a development process are carried out to form a second photoresist pattern having a photoresist pattern 201 corresponding to the data line to be formed and a photoresist pattern 202 corresponding to the pixel electrode to be formed, as shown in FIG. 2. The photoresist pattern 201 is relatively thin in thickness, i.e., it is a partially retained photoresist region 23 in the second photolithography process. The photoresist pattern 202 is relatively thick thickness, i.e., it is a fully retained photoresist region 23' in the second photolithography process. Other region corresponds to the non-photoresist region, as shown in FIG. 2A. Then, etching is carried out with the photoresist patterns as an etching mask on the non-photoresist region so that the source/drain electrode layer 22, the transparent pixel electrode layer 21, the doped semiconductor layer 14 and the semiconductor layer 13 which are not covered by the photoresist are removed. As a result, the source electrode 203 together with the data line, the drain electrode 204 together with the pixel electrode, and the channel of the semiconductor layer defined between the source electrode 203 and the drain electrode 204 are formed. Then, an ashing process on photoresist is carried out so that the source electrode 203 and the data line are exposed and the thick photoresist pattern 202 (i.e., the fully retained photoresist region 23') is thinned in thickness, as shown in FIG. 2C.

Figure 2D:
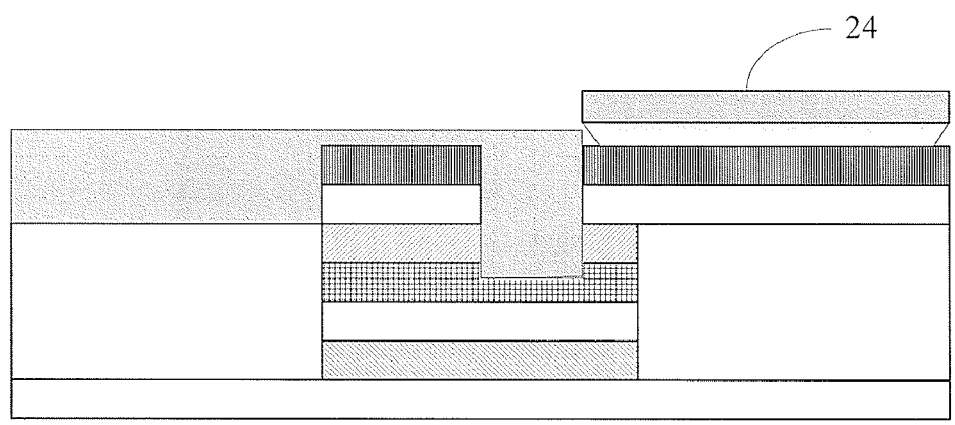
FIG. 2D is a cross-sectional view along line A-A' in FIG. 2 after deposition of the passivation layer during the second photolithography process.
Figure 2E:
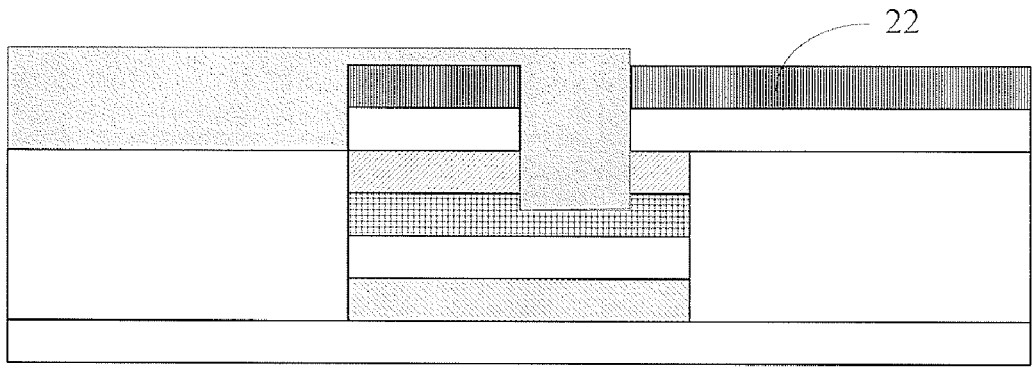
FIG. 2E is a cross-sectional view along line A-A' in FIG. 2 after the lift-off process during the second photolithography process.
Figure 2F:
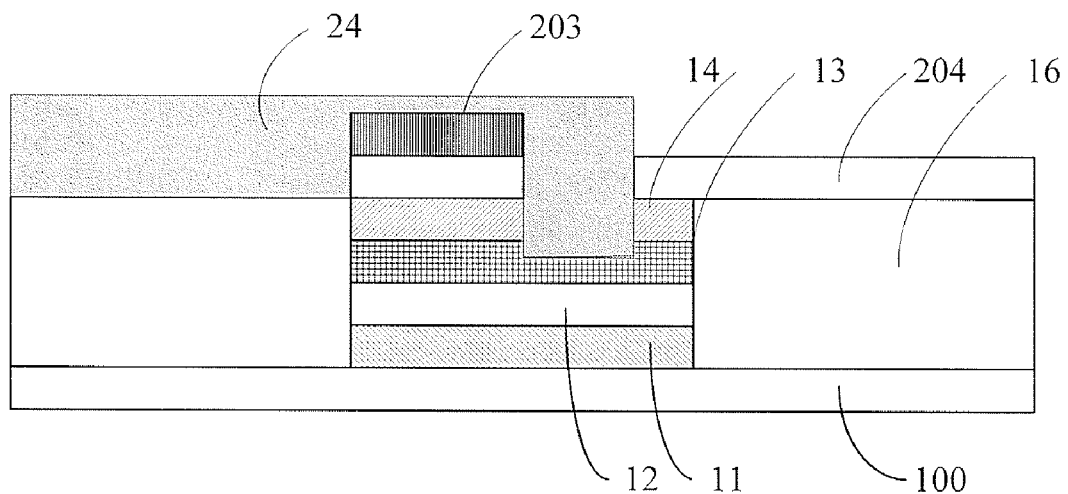
FIG. 2F is a cross-sectional view along line A-A' in FIG. 2 after etching of the source/drain metal layer during the second photolithography process.

Then, a passivation layer 24 is deposited on the resultant structure, as shown in FIG. 2D. A lift-off process is carried out to remove the photoresist 23' together with the passivation layer deposited thereon. The cross-sectional view along line A-A' in FIG. 2 after the lift-off process is shown in FIG. 2E. Since the region corresponding to the source electrode 203 and the data line is protected by the passivation layer, an etching process is carried out on the pixel electrode region to etch away the source/drain electrode layer 22 in the region corresponding to the pixel electrode to be formed and expose the transparent pixel electrode layer 21 as the pixel electrode, as shown in FIG. 2F. In this way, the manufacturing process of the TFT-LCD pixel structure is completed here.

The transparent pixel electrode layer 21 may be formed of indium tin oxides (ITO) which is superior in conductivity and transparency and can block ultraviolet and far-infrared radiation as well as electronic radiation which is harmful to a human being. Therefore, ITO can be applied in the pixel structure to enhance the conductivity and transparency and block the ultraviolet and far-infrared radiation as well as electronic radiation which is harmful to a human being. In addition, indium zinc oxide, tin oxide and other transparent conductive material can be used for the transparent pixel electrode layer 21. The source/drain electrode layer 22 may be a single layer film of Mo, Mo/W or Cr, or a composite film of any combination of Mo, Mo/W and Cr.

In addition, different materials in the drawings are differently indicated in the drawings. Since the substrate 100, the source/drain electrode layer 22, the second insulating layer 16, and the transparent pixel electrode layer 21 are all transparent, these layers are illustrated with pure colors. One can refer to the indications in each drawing.

Furthermore, during the second gray tone photolithography process in the above embodiment, a portion of the transparent pixel electrode is also formed as the drain electrode of the TFT, which can avoid the problem about contact resistance.

Two masks can be used in the embodiment of the present invention to manufacture a TFT-LCD, thus the number of mask can be decreased, the cost for the array process and the occupation time can be reduced, and the production volume and yield can be improved compared with the conventional method. In addition, the conventional gray tone photolithography process and the lift-off process can be employed, which makes simple and convenient to implement the complete process.

The TFT manufactured by the method described above comprises a substrate 100, a gate line 101, a first insulating layer 12, a semiconductor layer 13, a doped semiconductor layer 14, a second insulating layer 16, a source electrode 203 which is a portion of a data line, a drain electrode 204 which is a portion of a pixel electrode, and a passivation layer 24. In the pixel structure of the embodiment of the present invention, the first insulating layer 12, the semiconductor layer 13, and the doped semiconductor layer 14 are disposed sequentially over the gate 102 and the gate line 101, the isolating groove 103 is formed on the gate line 101 and disconnects the semiconductor layer on the gate line, the second insulating layer 16 covers the isolating groove 103 as well as the portion of the substrate where the gate line 101 and the gate 102 are not formed, the transparent pixel electrode layer 21 is retained under the source electrode 203 which is integral with the data line, the drain electrode 204 which is integral with the pixel electrode is formed over the second insulating layer 16, that is, the pixel electrode is connected with the doped semiconductor layer 14 on the gate 102 at the place where the drain electrode 204 is formed, and the passivation layer 24 covers the portion of the substrate where the pixel electrode 204 is not formed, i.e., exposes the pixel electrode 204.

The surface of the second insulating layer 16 flushes with that of the doped semiconductor layer 14. The transparent pixel electrode layer 21 for forming the drain electrode 204 which is a portion of the pixel electrode is also retained under the source electrode 203 which is a portion of the data line.

In the embodiment described above, description is made by reference to the structure with one TFT and the manufacturing process thereof. There can be formed a plurality of TFTs on the substrate, and the TFTs can be manufactured simultaneously by the photolithography processes, in which case the isolating groove on the gate line can prevent the short circuit among the data lines.

The embodiment of the invention being thus described, it will be obvious that the same may be varied in many ways. Such variations are not to be regarded as a departure from the spirit and scope of the invention, and all such modifications as would be obvious to those skilled in the art are intended to be comprised within the scope of the following claims.

What is claimed is:

1. A thin film transistor liquid crystal display (TFT-LCD) pixel structure comprising:
   a gate line and a gate electrode formed on a substrate;
   a first insulating layer, a semiconductor layer, and a doped semiconductor layer formed sequentially on the gate electrode and the gate line, wherein an isolating groove is formed above the gate line which disconnects the semiconductor layer on the gate line;
   a second insulating layer covering the isolating groove and a portion of the substrate where the gate line and the gate are not formed;
   a pixel electrode formed on the second insulating layer, wherein the pixel electrode is integral with a drain electrode and is connected with the doped semiconductor layer on the gate electrode at a place where the drain electrode is formed;
   a source electrode, which is a portion of a data line, formed on the doped semiconductor layer; and
   a channel formed between the source electrode and the drain electrode.

2. The pixel structure according to claim 1, further comprising a passivation layer covering a portion of the substrate where the pixel electrode is not formed.

3. The pixel structure according to claim 1, wherein a surface of the second insulating layer is in level with that of the doped semiconductor layer.

4. The pixel structure according to claim 1, wherein a pixel electrode layer for forming the pixel electrode is retained under the data line.

5. The pixel structure according to claim 1, wherein the gate electrode and the gate line are a single layer film of a material selected from the group consisting of Al/Nd, Al, Cu, Mo, Mo/W and Cr.

6. The pixel structure according to claim 1, wherein the gate electrode and the gate line are a composite film of any combination of Al/Nd, Al, Cu, Mo, Mo/W and Cr.

7. The pixel structure according to claim 1, wherein the first insulating layer and the second insulating layer are a single layer film of a material selected from the group consisting of SiNx, SiOx and SiOxNy.

8. The pixel structure according to claim 1, wherein the first insulating layer and the second insulating layer are a composite film of any combination of SiNx, SiOx and SiOxNy.

9. The pixel structure according to claim 1, wherein the data line is a single layer film of a material selected from the group consisting of Mo, Mo/W and Cr.

10. The pixel structure according to claim 1, wherein the data line is a composite film of any combination of Mo, Mo/W and Cr.

11. A method for manufacturing a thin film transistor liquid crystal display (TFT-LCD) pixel structure comprising the steps of:
   (I) depositing sequentially a gate conductive layer, a first insulating layer, a semiconductor layer and a doped semiconductor layer on a substrate, forming a first photoresist pattern with a first gray tone mask to comprise a first non-photoresist region, a first partially retained photoresist region and a first fully retained photoresist region on the substrate; etching the first non-photoresist region to form a gate line and a gate electrode; ashing the first photoresist pattern to remove the photoresist in the first partially retained photoresist region to expose a portion of the doped semiconductor layer on the gate line and thin the photoresist in the first fully retained photoresist region, and then etching the exposed portion of the doped semiconductor layer and the underlying semiconductor layer to form an isolating groove above the gate line; depositing a second insulating layer, and lifting off the remained first photoresist pattern along with the second insulating layer deposited thereon on the gate line and the gate electrode; and
   (II) depositing sequentially a pixel electrode layer and a source/drain electrode layer on the substrate after step I, forming a second photoresist pattern with a second gray tone mask to comprise a second non-photoresist region, a second partially retained photoresist region and a second fully retained photoresist region; etching the second non-photoresist region to form a channel of a TFT, a pixel electrode and a drain electrode which is integral with the pixel electrode, and a data line and a source electrode which is integral with the data line; ashing the second photoresist pattern to remove the photoresist in the second partially retained photoresist region to expose the source electrode and the data line and thin the photoresist in the second fully retained photoresist region; depositing a passivation layer, lifting off the remained second photoresist pattern along with the passivation layer deposited thereon on the pixel electrode, and etching the source/drain electrode layer in the region on the substrate corresponding to the pixel electrode and the drain electrode to expose the pixel electrode.

12. The method according to claim 11, wherein the first non-photoresist region in the step I is a region where the gate line and the gate island are not formed, and the first partially retained photoresist region is a region corresponding to the isolating groove to be formed above the gate line.

13. The method according to claim 11, wherein etching the non-photoresist region in the step I comprises etching the doped semiconductor layer, the semiconductor layer, the first insulating layer and the gate conductive layer.

14. The method according to claim 12, wherein etching the non-photoresist region in the step I comprises etching the doped semiconductor layer, the semiconductor layer, the first insulating layer and the gate conductive layer.

15. The method according to claim 11, wherein in the step II, the second fully retained photoresist region corresponds to the pixel electrode and the drain electrode to be formed; the second partially retained photoresist region corresponds to the data line and the source electrode to be formed; and the second non-photoresist region corresponds to remaining region on the substrate.

16. The method according to claim 11, wherein etching the second non-photoresist region in the step II comprises etching the source/drain electrode layer, the pixel electrode, the doped semiconductor layer and a portion of the semiconductor layer.

17. The method according to claim 15, wherein etching the second non-photoresist region in the step II comprises etching the source/drain electrode layer, the pixel electrode, the doped semiconductor layer and a portion of the semiconductor layer.

* * * * *